United States Patent [19]

Hartranft et al.

[11] Patent Number: 5,650,666
[45] Date of Patent: Jul. 22, 1997

[54] METHOD AND APPARATUS FOR PREVENTING CRACKS IN SEMICONDUCTOR DIE

[75] Inventors: Marc Hartranft, Scotts Valley; Pat Zicolello, Santa Clara, both of Calif.

[73] Assignee: Cypress Semiconductor Corp., Calif.

[21] Appl. No.: 562,125

[22] Filed: Nov. 22, 1995

[51] Int. Cl.$^6$ .............. H01L 23/48; H01L 23/52; H01L 29/40
[52] U.S. Cl. .............................. 257/776; 257/727
[58] Field of Search .................... 257/776, 727, 257/774, 777, 698, 669, 748, 750, 751, 752, 758, 759

[56] References Cited

U.S. PATENT DOCUMENTS

| | | | |
|---|---|---|---|
| 4,926,234 | 5/1990 | Katoh | 257/774 |
| 5,468,996 | 11/1995 | Chan et al. | 257/726 |

OTHER PUBLICATIONS

Integrated Circuit Engineering Corporation, Construction Analysis, *"Altera EPM7256EQC160-20 EPLD"*, Scottsdale, AZ., Report No.: SCA9512-443, pp. 1-3, Fig. 7.

TI Technical Journal, May-Jun. 1988 Issue, pp. 96-108, article entitled, "Shear Stress Damage to Chips: A Design Solution", authored by Paul Nixon and Darvin Edwards.

*Primary Examiner*—Mahshid D. Saadat
*Assistant Examiner*—S. V. Clark
*Attorney, Agent, or Firm*—Blakely, Sokoloff, Taylor & Zafman, LLP

[57] ABSTRACT

An anchor structure placed in an open field in corner areas of the semiconductor die and along die edges for preventing cracks in the die. In the corner areas, the anchor structure is placed perpendicular to a resultant vector force, which is approximately at a 45° angle to an imaginary horizontal line passing through the die. This perpendicular placement of the anchor structure more uniformly distributes the stresses along the anchor preventing corner cracks in the die. Along the die edges, the anchor structures are placed approximately perpendicular to the resultant vector forces that impinge the die edges.

9 Claims, 4 Drawing Sheets

METHOD AND APPARATUS FOR PREVENTING CRACKS IN SEMICONDUCTOR DIE

BACKGROUND OF THE INVENTION

1. Field of the Invention

The present invention relates generally to the field of electrical devices. More particularly, the present invention relates to the field of semiconductor devices.

2. Description of the Related Art

A trend in the computer industry is to integrate more system functions onto a single chip through large scale integration (LSI) and very large scale integration (VLSI) designs. As more and more functions are integrated onto a single chip, chip sizes have generally increased. At the same time, there is a trend in the computer industry towards smaller package outlines (e.g., minimizing plastic packaging) with an emphasis on surface-mount packages.

These two trends inevitably lead to increased mechanical stresses on the plastic package and on the chip itself. For example, the occurrence of cracks from die mounting, deformed metal, passivation cracks, and multi-layer oxide cracks has increased.

Many of these cracks are created by package-induced surface shear stresses. These stresses are most pronounced at chip corners in passivations over wide aluminum buses, in narrow polysilicon interconnects passing under the wide bus, and in the multi-level oxides along the edges of the buses. These stresses can lead to degraded leakage and corrosion performance. In the case of multi-layer oxide cracks, these cracks can cause complete device failure.

Temperature cycle testing is implemented as a phase in the qualification of large plastic-packaged chips due to the above discussed stresses. For example, present qualification guidelines require a device to pass 1,000 cycles of −65° C. to 150° C.

Chip manufacturers have attempted to minimize the above discussed problems in several ways. Several of these methods to minimize shear stress damage to chips are outlined in Texas Instruments Technical Journal, "*Shear Stress Damage to Chips: A Design Solution*," by Paul Nixon and Darvin Edwards. First, chip manufacturers reserve specific areas in the corners where there are no metal, poly-structures or active circuits therein. Second, chip manufacturers layout metal lines and buses at a 45° angle in corner areas outside the specific area, noted above.

Although all these above-mentioned methods provide limited improvement in the occurrence of die cracking, none of these methods eliminate the failure mode. Moreover, as process techniques for the manufacture of wafers migrate to tighter geometries and smaller feature size devices, the semiconductor die may become more susceptible to die cracking. Thus, there is a need to find a method and apparatus for preventing shear stress damage to a semiconductor chip.

SUMMARY OF THE INVENTION

A method and apparatus for preventing shear stress damage to a semi-conductor chip is described. Open fields (e.g., no buses or active circuits) in the corner areas of a semiconductor die and along the die edges are reserved. An anchor structure including metal and polysilicon is formed in these open fields. In the corner area of the die, these anchor structures are placed perpendicular to a resultant vector force, which is at approximately a 45° angle to an imaginary horizontal line passing through the semiconductor die. This perpendicular placement of anchor structures that are perpendicular to the resultant vector force more uniformly distributes the stress along the anchors preventing corner cracks in the semiconductor die. Similarly, along the die edges, anchor structures are placed perpendicular to the vector forces that impinge along the die edges.

BRIEF DESCRIPTION OF THE DRAWINGS

The present invention is illustrated by way of example and not limitation in the figures of the accompanying drawings in which like references indicate similar elements.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, details of well-known process steps and techniques are omitted in order not to obscure the present invention unnecessarily.

An anchor structure for preventing corner cracks in semiconductor die will now be described.

First, open field areas in the corner areas of a semiconductor die or integrated circuit (IC) and along the die edges are reserved. An open field is simply an area in the semiconductor die where there are no buses and no active circuits. It should be noted that open areas can and do exist in areas along edge of die and are not necessarily confined to the corners. Thus, in the process of laying out the circuits and buses on the surface area of the die, these open field areas are reserved such that no buses and circuits are placed in these areas. This process of laying out is usually performed by well known "CAD" software for designing ICs.

Second, anchor structures are placed in these open fields. The anchor structures are placed in these open areas by use of the conventional CAD software. In one embodiment, these anchor structures include polysilicon and any existing metal layers in the die. The polysilicon is simply connected to all existing metal layers to form an anchor structure although these structures are not electrically coupled to active components or circuits or buses on the IC.

The placement of these anchor structures should be controlled. The anchor structures are placed perpendicular to a typical resultant vector force so that the force impinges on the anchor structure at approximately a 90° angle. When the resultant vector force of the stress is approximately perpendicular to the anchor structure, the stress is more uniformly distributed along the anchor structure, eliminating single points along the anchor structure that may be subjected to a concentrated, higher and localized stress.

To ensure that the anchor structure is approximately perpendicular to the resultant force vector in the die corners, the anchor structure is placed at approximately a 45° angle to an imaginary horizontal line that passes through the semiconductor die. Along the die edges, the anchor structure is placed at approximately a 90° angle to the imaginary horizontal line.

Figure 1:
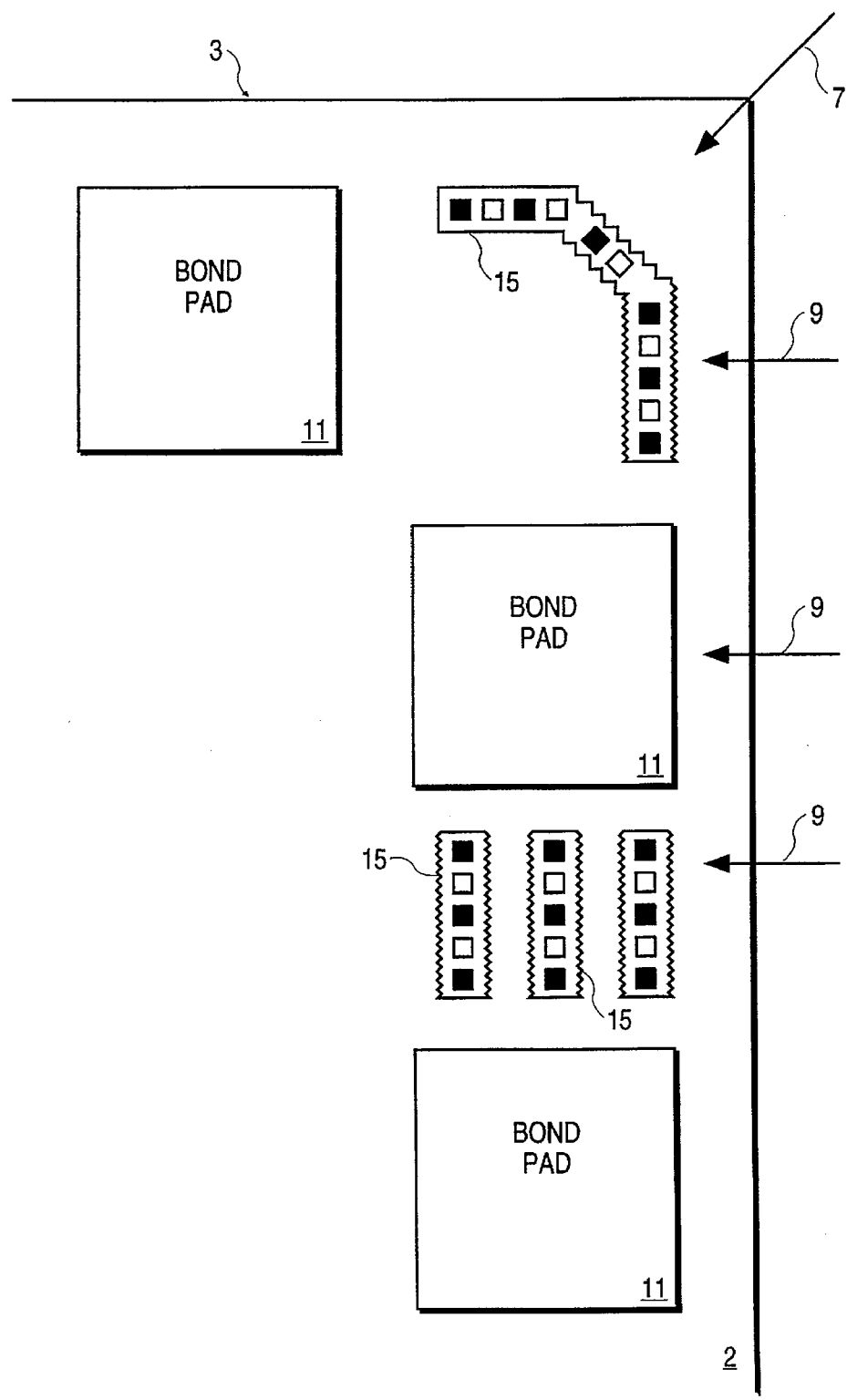
FIG. 1 illustrates a plan view of a semiconductor die in which the present invention may be implemented.

FIG. 1 illustrates a plan view of a semiconductor die in which the present invention may be implemented. Specifically, how the anchor structures of the present invention counteract the stress forces that impinge a semiconductor die is illustrated.

A semiconductor die 2 having die edges 3 is illustrated in FIG. 1. The semiconductor die 3 is exposed to a number of force vectors 7,9. For example, the corner of the semiconductor die is exposed to a force vector 7 that impinges the semiconductor die 2 at a 45° angle. Other force vectors 9 impinge the die edge 3 of the semiconductor die 2 at a 90° angle (i.e., perpendicular to the die edge 3). FIG. 1 also illustrates a plurality of bond pads 11 which are employed to receive and bond to bond wires (not shown), which are then coupled to the pins in a semiconductor die package. FIG. 1 also illustrates the anchor structures 15 of the present invention. These structures will be described in greater detail hereinafter.

Figure 2:
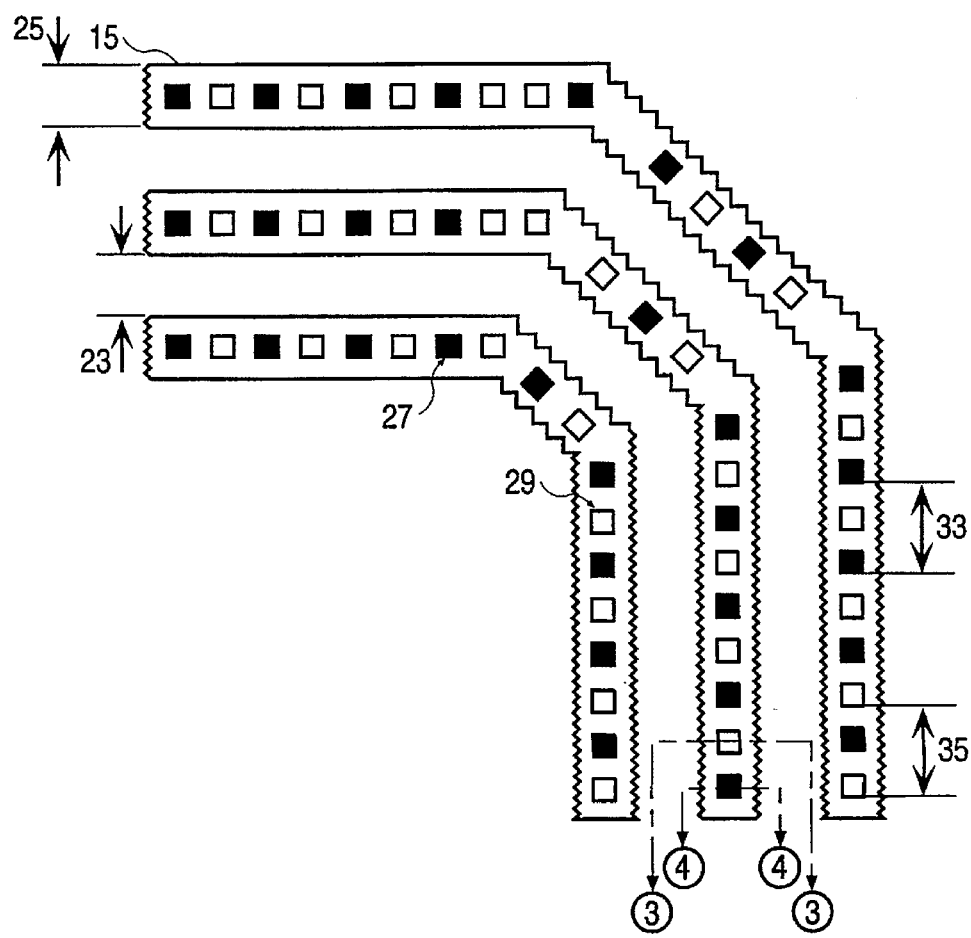
FIG. 2 illustrates the anchor structure of the present invention, as implemented in the corner of the semiconductor die.

FIG. 2 illustrates the anchor structure of the present invention, as implemented in the corner of the semiconductor die 2. The dimensions of an embodiment of an anchor structure including the widths and heights of the different layers will now be described.

In a preferred embodiment, the distance or space 23 between the anchor structures is approximately 5 um, and the width 25 of each anchor structure is approximately 3 um. The anchor structure 15 includes a plurality of via 27 and contact 29 openings. The pitch 33 between the vias 27 in the preferred embodiment, is approximately 3.1 um. The term, "pitch", is simply the distance between like features on a given edge. In the preferred embodiment, the pitch 35 between the contacts 29 is also approximately 3.1 um. The design rules referenced above, along with the associated values (i.e., pitch and width of the anchor structures), reflect the capability of one manufacturing process technology. It will be evident to those skilled in the art that these design rules and values can be scaled accordingly as more advanced technologies are utilized. For example, as one migrates from a 1 um process to a 0.35 um process, all the design rules and values will scale downwards accordingly.

Figure 3:
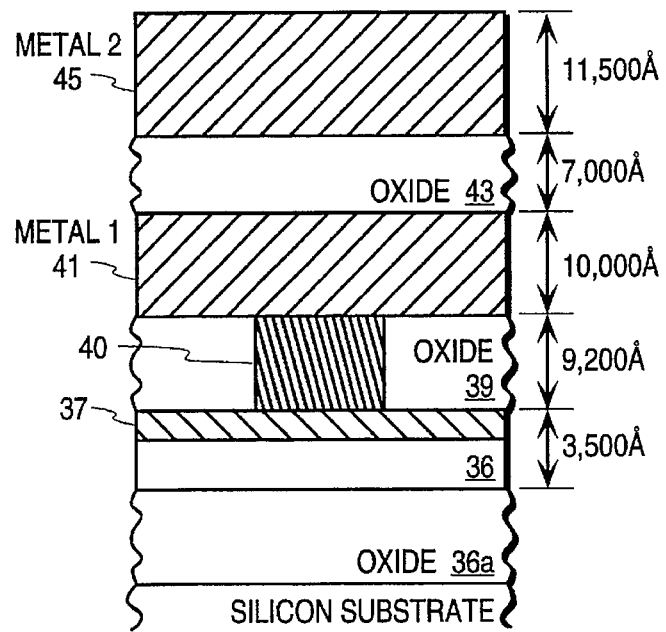
FIG. 3 illustrates an interior cross-sectional view of the anchor structures illustrated in FIG. 2, along the line 3—3.

FIG. 3 illustrates an interior cross-sectional view of the anchor structures 15, illustrated in FIG. 2, along the line 3—3. FIG. 3 illustrates that the anchor structure 15 of the present invention, in a preferred embodiment, includes a polysilicon layer 36, disposed on a field oxide layer 36a. The field oxide layer 36a is disposed on a semiconductor substrate. A silicide layer 37 that has an approximate thickness of 1,000 A is disposed on the polysilicon layer 36. The combination of the polysilicon layer 36 and the silicide layer 37 has an approximate thickness of 3,500 A. A first oxide layer 39, disposed on the silicide layer 37, has an approximate thickness of 9,200 A. A contact opening 40 is patterned in the oxide layer 39. The term, "pattern", as used in this application, refers to both the processing steps of photolithography and etch. A first metal layer 41 is disposed on top of the oxide layer 39 and has an approximate thickness of 10,000 A. A second oxide layer 43 is disposed on top of the first metal layer 41 and has an approximate thickness of 7,000 A. Also, a second metal layer 45 is disposed on top of the second oxide layer 43 and has an approximate thickness of 11,500 A. The fabrication process steps for forming these layers and the resulting structure will be understood by those of ordinary skill in the art.

Figure 4:
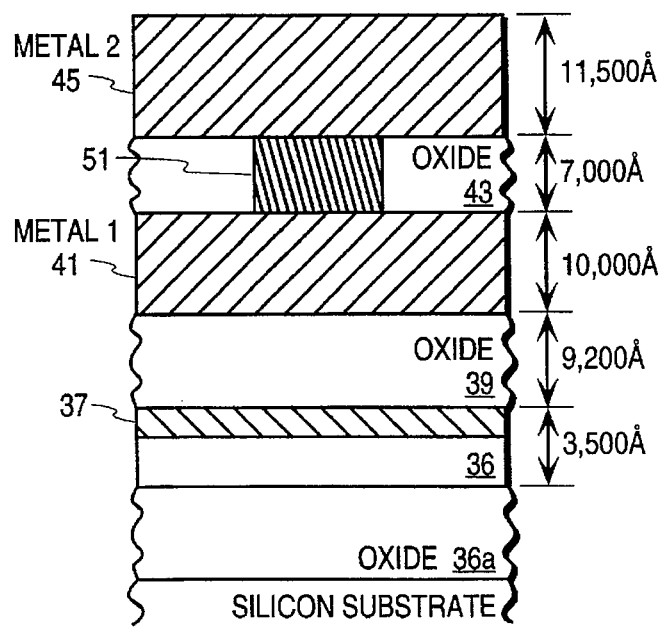
FIG. 4 illustrates an interior cross-sectional view of the anchor structure, illustrated in FIG. 2, along the line 4—4.

FIG. 4 illustrates an interior cross-sectional view of the anchor structure 15, illustrated in FIG. 2, along the line 4—4. FIG. 4 illustrates the polysilicon layer 36, disposed on the field oxide layer 36a. The silicide layer 37, disposed on the polysilicon layer 36, has an approximate thickness of 1,000 A. The combination of the polysilicon layer 36 and the silicide layer 37 has a thickness of approximately 3,500 A. The first oxide layer 39, disposed over the poly-silicide layer, has an approximate thickness of 9,200 A. The first metal layer 41 has an approximate thickness of 10,000 A, and is formed over the first oxide layer 39. The second oxide layer 43 is disposed between the first metal layer 41 and the second metal layer 45. A via opening 51 is patterned in the second oxide layer 43. The via opening 51 is disposed between the first metal layer 41 and the second metal layer 45. The via opening 51 that has an approximate thickness of 7,000 A may be filled with a metal (e.g., tungsten or aluminum). The fabrication process steps for forming these layers and the resulting structure will be understood by those of ordinary skill in the art.

The first metal layer 41 (commonly referred to in the art as a Metal 1 layer) and the second metal layer 45 (commonly referred to in the art as a Metal 2 layer) are formed in one embodiment by the following steps:

1) depositing a thin layer of titanium;
2) depositing a thin layer of titanium-tungsten;
3) depositing a thick layer of aluminum (e.g., 5 to 10 angstroms); and
4) depositing an oxide layer.

The process for forming the Metal 1 and Metal 2 layers (41 and 45, respectively) are well known in the art.

The via feature 27 and the contact feature 29, illustrated in FIG. 2, are for illustration purposes only. Please note that in reality one would only see the anchor structures without the black and white features (shown in FIG. 2) that represent the via feature 27 and the contact feature 29. In fact, one would only see the second metal layer 45 since it is the top layer in these figures. The via feature 27 and the contact feature 29 are merely convenient ways to illustrate that those segments of the anchor structure include the cross-sectional views illustrated in FIG. 3 and FIG. 4.

Although not shown in any of the figures, it should be noted that the via opening 51 may be stacked directly on top of the contact opening 40 when both the via opening 51 and the contact opening 40 are filled with a metal such as tungsten. If the via opening 51 and the contact opening 40 are not both filled with a metal, the via opening 51 and the contact opening 40 are generally not stacked.

In the case where the contact opening 40 is not filled with metal, the metal one layer 41 instead of having co-planer top and bottom surfaces, as illustrated in FIG. 3, would fill the contact opening 40 (i.e., the cross section of the top and bottom surfaces would form a "U"-shaped pattern). In other words, the first metal layer 41 would contact the silicide layer 37 through the contact opening 40. Similarly, referring to FIG. 4, if the via opening 51 is not filled with a metal such as tungsten, the second metal layer 45 would contact the first metal layer 41 through the via opening 51. In fact, the second metal layer 45, instead of the co-planer surface (as seen from above), illustrated in FIG. 4, would be a U-shaped dimple.

In implementing the teachings of the present invention, attention should be paid to the placement of the anchor structure. In the die corners, the anchor structure is placed approximately perpendicular to a resultant force vector 7 and is situated at approximately a 45° angle with the imaginary horizontal line (not shown) passing through the semiconductor die. The term, "approximately", when used to describe the 45° angle refers specifically to a range of degrees around the value of 45°. Specifically, in the present invention, the word, "approximately", when used to describe the 45° angle refers to a tolerance range of 45°+/−10%. With respect to the anchor structures along the die edges, the word "approximately", when used to describe the 90° angle (with respect to the horizontal line) refers to a tolerance of 90°+/−10%.

As previously described, the anchor structures 15 include a plurality of different layers such as a via layer 51, oxide layers, a substrate layer and a plurality of metal layers 41, 45. It is important to note that the anchor structure is electrically isolated from any active signals. The anchor structure may be connected to a $V_{ss}$(ground) to prevent the anchor from "floating". The connection to ground is made through the silicon or polysilicide to a ground plane for example.

The first 41 and second metal 45 layers are typically made of a metal (e.g., aluminum, tungsten, titanium, Titanium-tungsten alloy (TiW)). The via layer 51 may also be filled with aluminum or tungsten. The polysilicon layer 36 may be made of poly-silicide.

Figure 5:
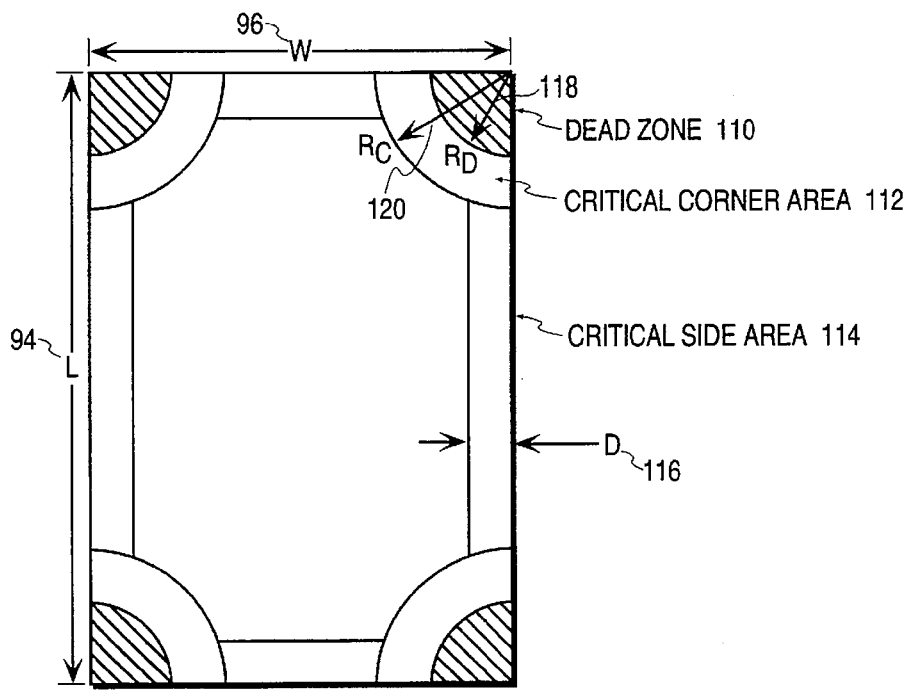
FIG. 5 illustrates the different areas in a semiconductor die in which the present invention may be implemented.

FIG. 5 illustrates where in a semiconductor die the teachings of the present invention may be implemented. FIG. 5 illustrates a die having a length (L) 94 and a width (W) 96. This die includes a dead zone 110, a critical corner area 112, a critical side area 114 and an associated width (W) 116. Moreover, FIG. 5 illustrates two radii, $R_d$ 118 and $R_c$ 120.

In a preferred embodiment, the following stress reduction rules should be implemented in the layout and design of an IC. For a chip of length 94 less than approximately 200 mils, the critical corner area 112 is within a radius ($R_c$) of approximately 6 mils from the corners of the die, and the critical side area 114 is located within a distance (D) 116 of approximately 4.0 mils from the edge of the die. In this particular embodiment, there is no dead zone when the chip length 94 is less than approximately 200 mils.

For chips having a length 94 between approximately 200 mils and 480 mils, the critical corner area 112 is within a radius ($R_c$) of approximately 15 mils from the corners of the die, and the critical side area 114 is located within a distance 116 of approximately 6.25 mils from the edge of the die. In this case, there is also no dead zone 110.

For a chip length 94 greater than approximately 480 mils, the critical corner area 112 is within a radius ($R_c$) of approximately 25 mils from the corners of the die, and the critical side area 114 is located within a distance 116 of approximately 10 mils from the edge of the die. The dead zone 110 is contained within a radius ($R_d$) of approximately 15 mils from the corner of the die.

The term "approximately" when used in conjunction to describe $R_c$, the length of the die 94, the distance (D) 116 in this application, refers specifically to a tolerance range of +/−10% of the value in question. For example, the description of a distance 116 of approximately 4 mils refers to distances of 4 mils +/−10%.

Figure 6:
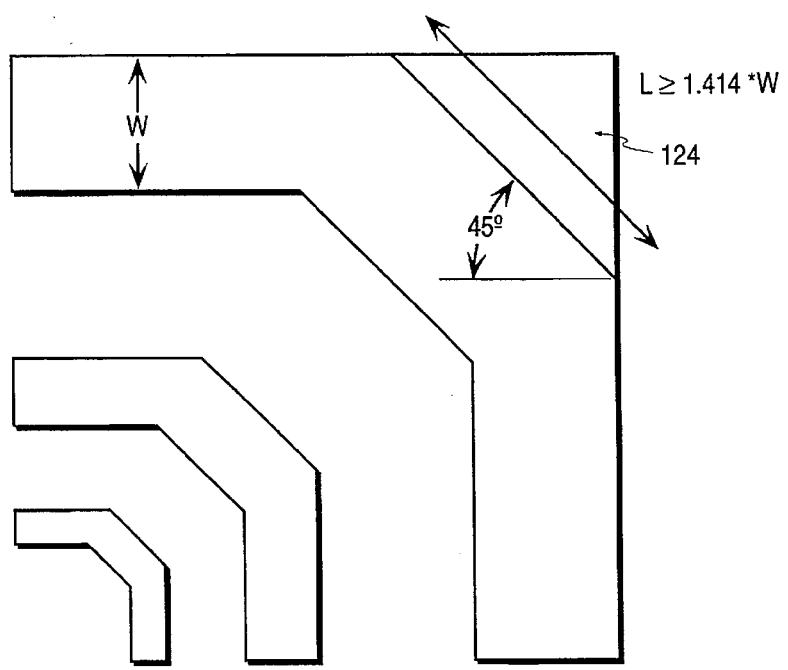
FIG. 6 illustrates three metal buses that are configured in accordance with the teachings of the present invention.

FIG. 6 illustrates three metal buses arranged in accordance with the teachings of the present invention. The metal buses in the corner areas are configured such that they are situated at approximately a 45° angle with an imaginary horizontal line passing through the semiconductor die. The area 124 includes the anchor structures of the present invention.

The processing steps employed in making one embodiment of the present invention are described herein. First, one deposits and patterns a layer of polysilicon. Then, a first oxide layer is deposited over the layer of polysilicon. Next, a contact opening is patterned (i.e., the processing steps of photolithography and etching are employed to create the contact opening). Following the patterning of the contact openings, a first metal layer is deposited and patterned. Next, a second oxide layer is deposited. After the second oxide layer is deposited, a via opening is patterned in the second oxide. After the via openings have been patterned, a second metal layer is deposited and patterned. Last, a passivation oxide layer is deposited onto the second metal layer, and openings are patterned in this passivation oxide over the bond pads so that bond wires may be coupled to the bond pads through these openings.

In order to fill the via or contact opening with a metal, the following steps are followed. A tungsten or aluminum layer is deposited onto the wafer, which results in the contact or via holes being filled with this metal. In the case of tungsten fill, the excess tungsten layer that is outside the via and contact openings is etched away (e.g., polished off).

The teaching of the present invention may be readily implemented in layout rules for semiconductor devices. In the foregoing specification, the invention has been described with reference to specific exemplary embodiments thereof. It will however be evident that various modifications and changes may be made thereto without departing from the broader spirit and scope of the invention as set forth in the appended claims. The specification and drawings are accordingly to be regarded as illustrative rather than restrictive.

What is claimed is:

1. In a semi-conductor die having corner areas and edges each with open fields in which no active buses or circuits are located, an anchor structure comprising:

a substrate layer;

a first metal layer disposed over said substrate layer; and an oxide layer disposed over said first metal layer;

wherein the anchor structure is placed in an open field of a corner area and is positioned to be approximately perpendicular to a force vector impinging on the semi-conductor die at approximately a 45° angle with respect to an imaginary line passing horizontally through the semiconductor die.

2. The anchor structure as set forth in claim 1, wherein the anchor structure is further placed in an open field along the die edges, and is positioned to be approximately perpendicular to a force vector impinging on the die edges.

3. The anchor structure as set forth in claim 1 further comprising a second metal layer disposed over the oxide layer; and a via opening, formed in the oxide layer, between the first metal layer and the second metal layer.

4. The anchor structure as set forth in claim 2 further comprising a second metal layer disposed over the oxide layer; and a via opening, formed in the oxide layer, between the first metal layer and the second metal layer.

5. The anchor structure as set forth in claim 1 wherein said substrate layer is composed of silicon.

6. The anchor structure as set forth in claim 2 wherein said substrate layer is composed of silicon.

7. The anchor structure as set forth in claim 1 further comprising a further oxide layer disposed between the substrate layer and the first metal layer.

8. The anchor structure as set forth in claim 1 wherein the open field of the corner area exists in a region of the semiconductor die having as boundaries two approximately perpendicular and intersecting edges of the semiconductor die and an arc having a radius of less than approximately 5½% of the length of the semiconductor die subtended from the point of intersection of the two edges of the semiconductor die.

9. The anchor structure as set forth in claim 2 wherein the open field along the die edge exists in a region having a boundary located a distance of approximately 3% or less of the length of the semiconductor die from the edge of the semiconductor die.

* * * * *

UNITED STATES PATENT AND TRADEMARK OFFICE
CERTIFICATE OF CORRECTION

PATENT NO.   : 5,650,666
DATED        : July 22, 1997
INVENTOR(S)  : Hartranft et al.

It is certified that error appears in the above-identified patent and that said Letters Patent is hereby corrected as shown below:

In column 6 at line 37 delete "comer" and insert --corner--

In column 7 at line 2 delete "comer" and insert --corner--

Signed and Sealed this

Sixteenth Day of December, 1997

*Attest:*

BRUCE LEHMAN

*Attesting Officer*　　　*Commissioner of Patents and Trademarks*